US012588159B2

(12) United States Patent　　(10) Patent No.:　US 12,588,159 B2
Larsen et al.　　(45) Date of Patent:　Mar. 24, 2026

(54) DUAL HINGE CABLE MANAGEMENT COVER

(71) Applicant: Legrand DPC, LLC, West Hartford, CT (US)

(72) Inventors: Lars R. Larsen, Cary, NC (US); Chris Vacca, Westerly, RI (US)

(73) Assignee: Legrand DPC, LLC, West Hartford, CT (US)

(*) Notice: Subject to any disclaimer, the term of this patent is extended or adjusted under 35 U.S.C. 154(b) by 220 days.

(21) Appl. No.: 18/596,219

(22) Filed: Mar. 5, 2024

(65) Prior Publication Data

US 2024/0306341 A1　　Sep. 12, 2024

Related U.S. Application Data

(60) Provisional application No. 63/450,508, filed on Mar. 7, 2023.

(51) Int. Cl.
H05K 7/14　　(2006.01)
H05K 7/18　　(2006.01)

(52) U.S. Cl.
CPC ........... H05K 7/1491 (2013.01); H05K 7/186 (2013.01)

(58) Field of Classification Search
None
See application file for complete search history.

(56) References Cited

U.S. PATENT DOCUMENTS

| | | | | |
|---|---|---|---|---|
| 5,024,614 A | * | 6/1991 | Dola | H02G 3/0431 |
| | | | | 174/491 |
| 6,101,773 A | * | 8/2000 | Chau | H02G 3/288 |
| | | | | 248/68.1 |
| 7,083,051 B2 | * | 8/2006 | Smith | H02G 3/30 |
| | | | | 248/220.42 |
| 7,225,586 B2 | | 6/2007 | Levesque et al. | |
| 7,762,405 B2 | * | 7/2010 | Vogel | H04Q 1/13 |
| | | | | 361/826 |
| 7,999,183 B2 | | 8/2011 | Garza et al. | |

(Continued)

FOREIGN PATENT DOCUMENTS

WO　　2005010304 A1　　2/2005

OTHER PUBLICATIONS

Hubbell Premise Wiring, Hubbel Premise Wiring Max Series Vertical Cable Manager VM1020, undated.

(Continued)

*Primary Examiner* — Krystal Robinson
(74) *Attorney, Agent, or Firm* — McCarter & English, LLP

(57)　　ABSTRACT

An example cable management cover is provided. The cover includes a panel defining a first side edge and a second side edge opposing the first side edge. The cover includes first and second handles slidably coupled to the respective first and second side edges of the panel. The cover includes a first pair of pins associated with the first handle and movable with the first handle during sliding of the first handle along the first side edge. The cover includes a second pair of pins associated with the second handle and movable with the second handle during sliding of the second handle along the second side edge. The first pair of pins define a first axis of rotation about which the cable management cover is rotatable, and the second pair of pins define a second axis of rotation about which the cable management cover is rotatable.

20 Claims, 10 Drawing Sheets

(56) References Cited

U.S. PATENT DOCUMENTS

| | | | | |
|---|---|---|---|---|
| 8,881,916 B2 | | 11/2014 | Vogel et al. | |
| 9,303,440 B2 | | 4/2016 | Larsen et al. | |
| 11,617,275 B2 | * | 3/2023 | Merrell | H05K 5/0247 |
| | | | | 361/679.01 |
| 2005/0115152 A1 | * | 6/2005 | Levesque | H05K 7/186 |
| | | | | 49/192 |
| 2007/0054528 A1 | * | 3/2007 | Caveney | H01R 9/2416 |
| | | | | 439/244 |
| 2007/0175654 A1 | * | 8/2007 | Keith | H04Q 1/06 |
| | | | | 174/135 |
| 2009/0032651 A1 | * | 2/2009 | Sayres | H02G 3/0418 |
| | | | | 248/68.1 |

OTHER PUBLICATIONS

Panduit, Panduit PatchRunner 2 Vertical Manager PR2VD10, 2019.
Search Report from related European Patent Application No. 24161657.2
issued Jul. 23, 2024.

* cited by examiner

DUAL HINGE CABLE MANAGEMENT COVER

CROSS-REFERENCE TO RELATED APPLICATIONS

This application claims the benefit of a co-pending, commonly assigned U.S. Provisional Patent Application No. 63/450,508, which was filed on Mar. 7, 2023. The entire content of the foregoing provisional application is incorporated herein by reference.

BACKGROUND

Media patching systems for copper and/or fiber patch cords of the telecommunications industry are typically stored in racks. Such racks are typically positioned adjacent to each other with vertical patch cord managers on the sides and/or in-between the racks. The vertical patch cord managers require a cover that can be opened to the right or left, or be removed all together, to provide access to the cords behind the cover. Conventional vertical manager covers are typically inexpensive designs that are difficult to operate or complicated designs that are easy to operate but may be too costly for smaller installations. For example, some conventional vertical manager covers can include multiple rotating handles or knobs to operate the latching mechanisms, multiple snap latches that require mechanical operation to open the door/cover, or complicated spring-loaded mechanisms that increase manufacturing costs.

SUMMARY

Embodiments of the present disclosure provide a dual hinge cable management cover for a vertical patch cord manager in-between racks. The exemplary cover provides a simple design that allows for opening of the cover in either direction (right or left) depending on the needs of the user and the surrounding environment. The exemplary cover also allows the entire cover to be removed, if needed. The latch/handle system operates both top and bottom pins simultaneously, allowing for single-handed operation to open and pivot the cover on the desired side. The simple design of the cover reduces manufacturing costs, while providing a convenient cover that can be used in a variety of telecommunications environments.

The cover extends the full height of the vertical patch cord manager, can be opened from any position, and closes shut without necessitating actuation of the latch/handle system. The cover includes a unique design that uses a full height handle on each side with downward facing hinge/latch pins that are mounted at the top and bottom of each handle. The handles are attached to the covers with fasteners that only allow vertical sliding movement. The vertical manager includes pin retaining holes positioned at the top and bottom sides of the manager. Lifting the handle on either side of the cover disengages the pins, allowing the cover/door to open from the disengaged side. To close the cover, the handle can be lifted vertically and dropped into place in the closed position or by pushing the cover into the closed position which allows the lower pin to ride up an angled base until the pin is positioned over the hole on the manager and drops into place using only the weight of the handle.

The mechanism associated with the cover provides a simple method of hinging and latching the vertical manager cover (e.g., door) using sets of downward facing pins mounted to vertically sliding brackets (e.g., handles) on each side of the cover. The pins attached to these handles drop into holes in the base of the manager and holes in a bracket near the top of the manager which is mounted to the fingers and/or rear channel of the vertical manager. The two pins attached to the handle on one side of the cover act as the hinge, while the two pins on the other side are lifted to "unlatch" the cover allowing the cover to swing open from the hinge side. This allows both side handles to act as the hinge or the latch depending on which direction of cover swing is desired. The cover can be removed entirely by lifting straight up allowing all four pins to clear the base and bracket at the same time, and can be repositioning in the same manner. The base includes an angled slope on the front end or edge of the base to allow for automatic closing engagement of the cover without manipulating the handle. The handle acting as the latch side can be (but does not need to be) manually lifted to close the cover. However, pushing the cover closed from the open position without lifting the handle causes the pin on the latching handle to ride up the slope of the base and drop into the base hole for closing engagement. Selective opening and closing of the cover can therefore be conveniently achieved in any direction, depending on the needs of the user.

In accordance with embodiments of the present disclosure, an exemplary dual hinge cable management cover is provided. The cover includes a panel defining a front surface, a rear surface, a top edge, a bottom edge opposing the top edge, a first side edge, and a second side edge opposing the first side edge. The cover includes a first handle slidably coupled to the first side edge of the panel, and a second handle slidably coupled to the second side edge of the panel. The cover includes a first pair of pins associated with the first handle and movable with the first handle during sliding of the first handle along the first side edge of the panel. The cover includes a second pair of pins associated with the second handle and movable with the second handle during sliding of the second handle along the second side edge of the panel. The first pair of pins define a first axis of rotation about which the cable management cover is rotatable, and the second pair of pins define a second axis of rotation about which the cable management cover is rotatable.

The first pair of pins and the second pair of pins are configured to engage with holes of a patch cord manager or rack. Disengagement of the first pair of pins from the holes of the patch cord manager or rack allow for rotation of the cable management cover about the second axis of rotation defined by the second pair of pins. Disengagement of the second pair of pins from the holes of the patch cord manager or rack allow for rotation of the cable management cover about the first axis of rotation defined by the first pair of pins.

The first handle and the second handle can each define a substantially U-shaped configuration including a central member, a front side member extending perpendicularly from a first edge of the central member, and a rear side member extending perpendicularly from a second edge of the central member. The central member is configured to be disposed adjacent to the first side edge or the second side edge of the panel, respectively, the front side member is configured to be disposed adjacent to the front surface of the panel, and the rear side member is configured to be disposed adjacent to the rear surface of the panel.

The front side member includes holes configured to receive a fastener to couple the first handle or the second handle to the panel. The fastener is slidable within a complementary slot in the panel during sliding of the first handle or the second handle relative to the panel. The rear side member includes holes configured to receive extensions of the first pair of pins or the second pair of pins, respectively, to couple the first handle or the second handle to the panel. The extensions are slidable within a complementary slot in the panel during sliding of the first handle or the second handle relative to the panel. Each pin of the first pair of pins and the second pair of pins includes a body with a tapered endpoint extending from a bottom surface of the body. The tapered endpoint is configured to engage with holes of a patch cord manager or rack for locking of the cable management cover relative to the patch cord manager or rack.

In accordance with embodiments of the present disclosure, an exemplary cable management cover system is provided. The system includes a mounting bracket configured to be coupled at or near a top of a patch cord manager or rack. The mounting bracket includes a first hole and a second hole formed therein. The system includes a base configured to be coupled at or near a bottom of the patch cord manger or rack. The base includes a third hole and a fourth hole formed therein. The system includes a cable management cover pivotably and removably coupled to the mounting bracket and the base. The cover includes a panel defining a front surface, a rear surface, a top edge, a bottom edge opposing the top edge, a first side edge, and a second side edge opposing the first side edge. The cover includes a first handle slidably coupled to the first side edge of the panel, and a second handle slidably coupled to the second side edge of the panel. The cover includes a first pair of pins associated with the first handle and movable with the first handle during sliding of the first handle along the first side edge of the panel. The first pair of pins is configured to be engaged and disengaged relative to the first hole of the mounting bracket and the third hole of the base. The cover includes a second pair of pins associated with the second handle and movable with the second handle during sliding of the second handle along the second side edge of the panel. The second pair of pins is configured to be engaged and disengaged relative to the second hole of the mounting bracket and the fourth hole of the base. The first pair of pins define a first axis of rotation about which the cable management cover is rotatable relative to the patch cord manager or rack. The second pair of pins define a second axis of rotation about which the cable management cover is rotatable relative to the patch cord manager or rack.

The base can include a planar main body section including the third and fourth holes, and an angled section extending from a proximal edge of the planar main body section. The angled section extends downwardly from the proximal edge of the planar main body section such that a proximal edge of the angled section is disposed at a plane below a plane of the proximal edge of the planar main body section. One of the first pair of pins or one of the second pair of pins (depending on the pivot axis being used) is configured to engage with a travel upward along the angled section during pivoting of the cable management cover into a closed position.

The first handle and the second handle can each define a substantially U-shaped configuration including a central member, a front side member extending perpendicularly from a first edge of the central member, and a rear side member extending perpendicularly from a second edge of the central member. The central member is configured to be disposed adjacent to the first side edge or the second side edge of the panel, respectively, the front side member is configured to be disposed adjacent to the front surface of the panel, and the rear side member is configured to be disposed adjacent to the rear surface of the panel. The front side member includes holes configured to receive a fastener to couple the first handle or the second handle to the panel. The fastener is slidable within a complementary slot in the panel during sliding of the first handle or the second handle relative to the panel. The rear side member includes holes configured to receive extensions of the first pair of pins or the second pair of pins, respectively, to couple the first handle or the second handle to the panel. The extensions are slidable within a complementary slot in the panel during sliding of the first handle or the second handle relative to the panel.

Each pin of the first pair of pins and the second pair of pins includes a body with a tapered endpoint extending from a bottom surface of the body. The tapered endpoint is configured to engage with the first, second, third or fourth holes of the mounting bracket and the base, respectively, for locking of the cable management cover relative to the patch cord manager or rack. The first handle and the second handle are independently slidable upwards and downwards along a vertical direction relative to the respective first and second side edges of the panel to engage and disengage the first and second pairs of pins with the respective first, second, third, and fourth holes of the mounting bracket and the base.

In accordance with embodiments of the present disclosure, an exemplary method of cable management is provided. The method includes engaging a first pair of pins of a cable management cover with a first set of holes associated with a patch cord manager or rack. The cable management cover includes a first handle slidably coupled to a first side edge of a panel. The first pair of pins is associated with the first handle. The method includes engaging a second pair of pins of the cable management cover with a second set of holes associated with a patch cord manager or rack. The cable management cover includes a second handle slidably coupled to a second side edge of the panel. The second pair of pins is associated with the second handle. The cable management cover is operable by both sliding the first handle relative to the first side edge of the panel to disengage the first pair of pins from the first set of holes associated with the patch cord manager or rack to allow the second pair of pins to define an axis of rotation about which the cable management cover is rotatable relative to the patch cord manager or rack, and sliding the second handle relative to the second side edge of the panel to disengage the second pair of pins from the second set of holes associated with the patch cord manager or rack to allow the first pair of pins to define an axis of rotation about which the cable management cover is rotatable relative to the patch cord manager or rack.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the dual hinge cable management cover, reference is made to the accompanying figures, wherein.

DETAILED DESCRIPTION

Figure 1:
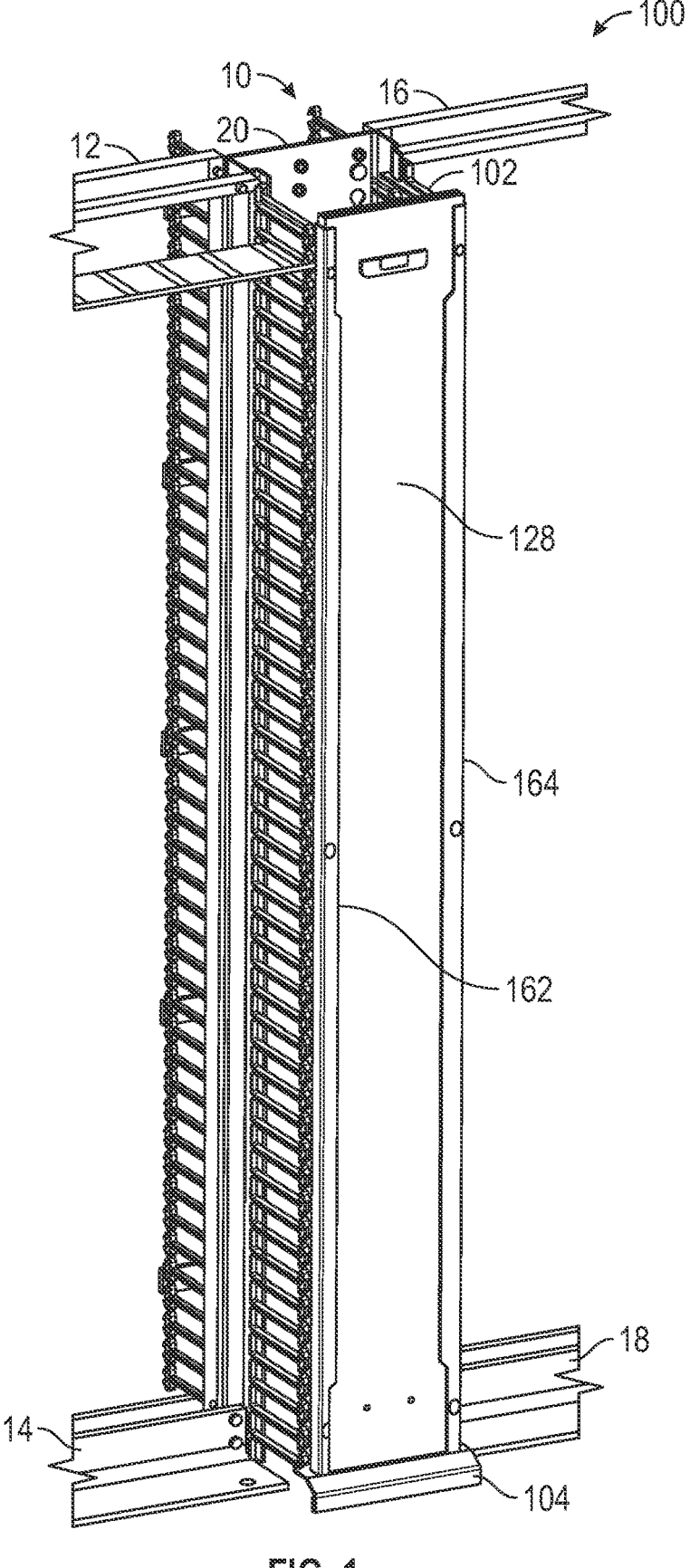
FIG. 1 is a perspective view of an exemplary dual hinge cable management cover in accordance with embodiments of the present disclosure detachably coupled to a patch cord manager.
Figure 2:
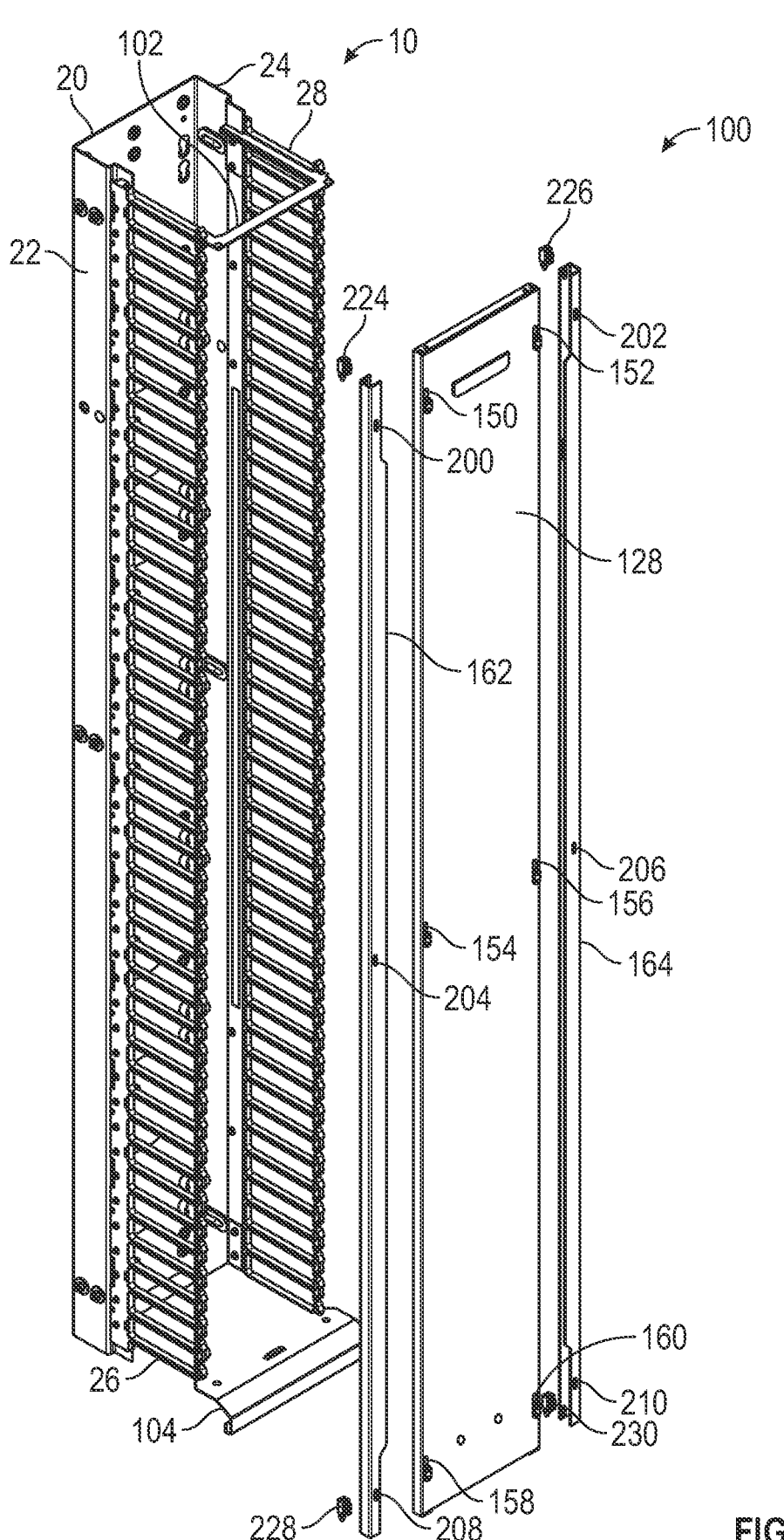
FIG. 2 is a perspective, exploded view of an exemplary dual hinge cable management cover of FIG. 1 and a patch cord manager.
Figure 3:
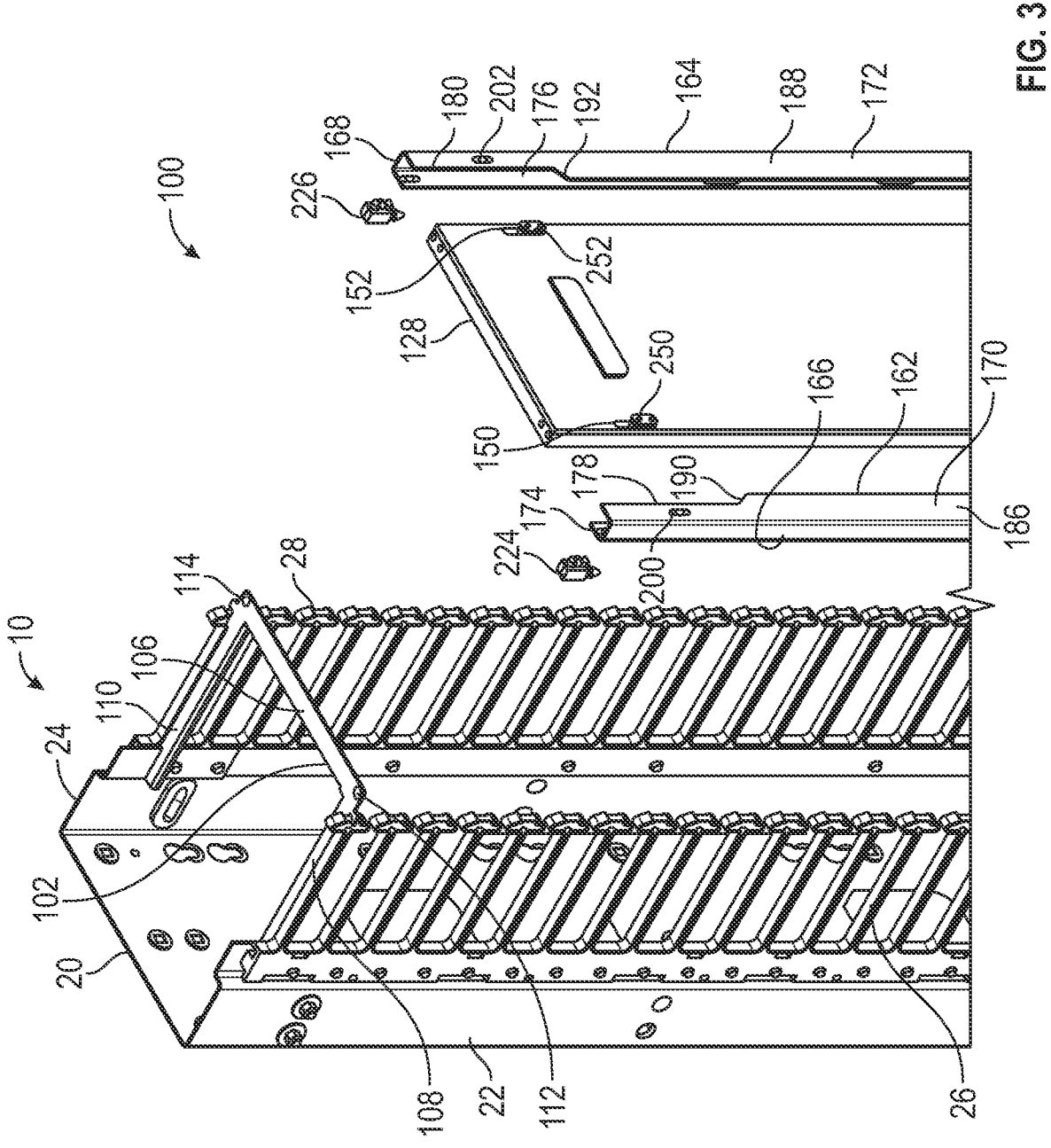
FIG. 3 is a detailed perspective, exploded view of a top section of an exemplary dual hinge cable management cover of FIG. 2 and a patch cord manager.
Figure 4:
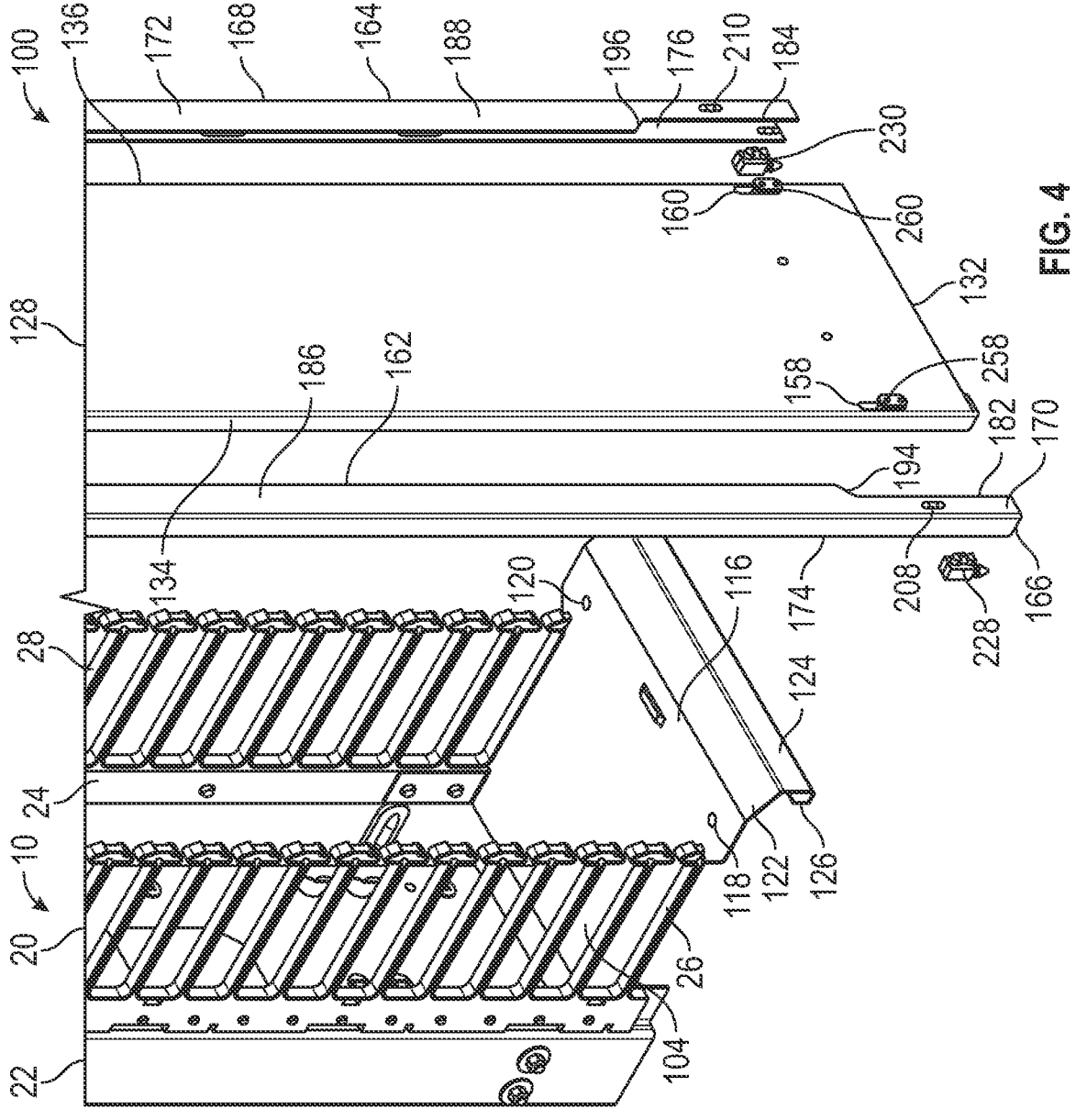
FIG. 4 is a detailed perspective, exploded view of a bottom section of an exemplary dual hinge cable management cover of FIG. 2 and a patch cord manager.

FIGS. 1-4 are perspective and detailed views of an exemplary dual hinge cable management cover 100 (hereinafter "cover 100"). In particular, FIGS. 1 and 2 show assembled and exploded views of the cover 100 installed relative to a vertical patch cord manager 10, and FIGS. 3 and 4 show details of the top and bottom assembly of the cover 100 relative to the patch cord manager 10. The patch cord manager 10 is generally mounted on one side to top and bottom frame members 12, 14 of one rack, and mounted on the opposing side to top and bottom frame members 16, 18 of a second rack.

The patch cord manager 10 includes a rear panel 20 that extends all or most of the height of the racks, and generally defines the back wall of the enclosure formed by the patch cord manager 10. The patch cord manager 10 includes left and right panels 22, 24 that extend substantially perpendicularly from the rear panel 20 to further define the enclosure formed by the patch cord manager 10. Cable management members 26, 28 (e.g., fingers) extend from the ends of the respective panels 22, 24, providing flexible structures that can be used to receive and capture cords extending through the patch cord manager 10. The cable management members 26, 28 can extend parallel to the panels 22, 24 to define a substantially square or rectangular enclosure within the patch cord manager 10.

For mounting of the cover 100 to the patch cord manager 10, a mounting bracket 102 and a base 104 can be secured to the top and bottom areas of the patch cord manager 10, respectively. The bracket 102 can define a substantially U-shaped configuration, including a front or proximal section 106, a first side section 108 extending perpendicularly from one end of the proximal section 106, and a second side section 110 extending perpendicularly from the opposing end of the proximal section 106. Each of sections 106-110 can define a substantially planar, mental flange or extension.

At or near the opposing corners of the proximal section 106, the bracket 102 includes openings 112, 114 extending therethrough. As discussed herein, the openings 112, 114 engage with pins to either lock the cover 100 to the patch cord manager 10 or to act as a hinge for the cover 100. The bracket 102 can be secured at or near the top of the patch cord manager 10 by coupling the ends of the sections 108, 110 to the panels 22, 24 such that the proximal section 106 of the bracket 102 extends at a plane beyond the ends of the cable management members 26, 28.

The base 104 includes a main body section 116 defining a planar panel configured to be mounted to the panels 22, 24, and extends both the width between the cable management members 26, 28 and the depth defined at least by the cable management members 26, 28. The proximal end of the main body section 116 extends beyond the plane defined by the ends of the cable management members 26, 28. At the opposing corners of this proximal end, the main body section 116 includes openings 118, 120 extending therethrough. The openings 118, 120 can be substantially aligned with the openings 112, 114 of the bracket 102 and also engage with pins to either lock the cover 100 to the patch cord manager 10 or to act as a hinge for the cover 10.

The base 104 includes an angled section 122 extending from or formed to extend from the proximal edge of the main body section 116. The angled section 122 extends downwardly at a slope such that the proximal edge of the angled section 122 is disposed at a plane below the plane defined by the main body section 116. In some embodiments, the angle of the angled section 122 can be about, e.g., 5-45° inclusive, 5-40° inclusive, 5-35° inclusive, 5-30° inclusive, 5-25° inclusive, 5-20° inclusive, 5-15° inclusive, 5-10° inclusive, 10-45° inclusive, 15-45° inclusive, 20-45° inclusive, 25-45° inclusive, 30-45° inclusive, 35-45° inclusive, 40-45° inclusive, 10-40° inclusive, 15-35° inclusive, 5°, 10°, 15°, 20°, 25°, 30°, 35°, 40°, 45°, or the like. The base 104 includes a front section 124 extending downwardly from the proximal edge of the angled section 122, and a bottom section 126 extending perpendicularly towards the rear of the assembly. The bottom section 126 can extend substantially parallel to the main body section 116.

In addition to FIGS. 1-4, FIGS. 5-12 illustrate detailed views of the cover 100. The cover 100 includes a door or panel 128 configured and dimensioned to extend the entire (or substantially entire) height and width of the patch cord manager 10. The panel 128 can define a substantially rectangular shape with a top edge 130, an opposing bottom edge 132, side edges 134, 136 that extend perpendicularly relative to the top and bottom edges 130, 132, and opposing front and rear surfaces 138, 140. At or near the corners of the top and/or bottom edges 130, 132, the panel 128 can include one or more openings 142, 144 extending into the body of the panel 128 (see, e.g., FIGS. 5-7). In some embodiments, the openings 142, 144 can receive plastic bushings in a snapped manner during the assembly process to assist with rotation of the panel 128.

At the rear surface 140 of the panel 128, specifically at or near each of the top and bottom corners of the rear surface 140, the panel 128 includes elongated cutouts or slots 146, 148. Although the slots at the bottom corners of the rear surface 140 are not visible, it should be understood that the configuration and dimensions of the slots at the bottom corner are equal to those of the slots 146, 148. The slots 146 extend into the hollow interior of the panel 128 without passing through to the front surface 138. The slots 146, 148 act as guides for travel of the respective pins 224-230 (discussed below), with the endpoints of the slots 146, 148 acting as stops or limits for the sliding range of each pin 224-230. In some embodiments, each slot 146, 148 can be substantially 1.2 inches long and substantially 0.3 inches wide. The slots 146, 148 at the top of the rear surface 140 extend downwardly from the top surface 130, while the slots at the bottom of the rear surface 140 extend upwardly from the bottom surface 132.

The panel 128 includes elongated cutouts or slots 150, 152, 154, 156, 158, 160 (collectively referred to as slots 150-160) extending from the front surface 138 to the rear surface 140 through the panel 128 (see, e.g., FIG. 2). Each slot 150-160 can be configured and dimensioned substantially equally to the slots 146, 148. The slots 150, 154, 158 can be formed on the left side of the panel 128, and the slots 152, 156, 160 can be formed on the right side of the panel 128. The slots 150-160 are laterally offset inwardly from the respective side edges 134, 136 and relative to the slots 146, 148 such that each of slots 150-160 is further laterally positioned than the slots 146, 148. The slots 146, 148 are therefore not in alignment with the respective slots 150-160, although the slots 146, 148 and slots 150-160 extend lengthwise parallel to each other.

The cover 100 includes two handles 162, 164 slidably coupled to opposing sides of the panel 128. As described herein, the length of the slots 146, 148 and the slots 150-160 provides a range and limit to sliding of the handles 162, 164 relative to the panel 128 for disengagement of the cover 100 from the patch cord manager 10. Each handle 162, 164 includes a central member 166, 168 extending the entire height of the respective handle 162, 164, a front or first side member 170, 172 extending perpendicularly from one edge of the central member 166, 168, and a rear or second side member 174, 176 extending perpendicularly from the opposing edge of the central member 166, 168, with each of the members 166-176 extending the entire height of the respective handle 162, 164. The members 166-176 can therefore define a substantially U-shaped configuration. The second side member 174, 176 can define the same width along the entire height of the second side member 174, 176. In contrast, the first side member 170, 172 include a top section 178, 180 and a bottom section 182, 184 that define a width substantially equal to the width of the second side member 174, 176, and a central section 186, 188 that defines a width greater than the width of the sections 178-184. Tapered or angled sections 190, 192, 194, 196 connect the respective top and bottom sections 178-184 to the central sections 186, 188. In some embodiments, the central member 166, 168 can be about 0.83 inches wide, and the side members 170, 172 and side members 174, 176 can be about 0.77 inches wide. In some embodiments, the angled sections 190-196 can extend at an angle of about 135°, and the width of the central sections 186, 188 can be about 1.27 inches. In some embodiments, the handle 162, 164 can have a uniform width of the side members 170, 172 and side members 174, 176 (e.g., with no angled sections 190-196 and no central sections 186, 188).

The height or length of the handles 162, 164 is dimensioned substantially equal to the height or length of the panel 128, thereby defining a "full height" handle 162, 164. The handle 162 is configured to be slidably installed along the side edge 134 of the panel 128, and the handle 164 is configured to be slidably installed along the side edge 136 of the panel 128. In the installed or assembled position, the central members 166, 168 are positioned adjacent to the respective side edges 134, 136 of the panel 128, the first side members 170, 172 are positioned adjacent to the front surface 138 of the panel 128, and the second side members 174, 176 are positioned adjacent to the rear surface 138 of the panel 128. In some embodiments, a gap 198 remains between the handles 162, 162 and the panel 128 at all times in the assembled configuration (see, e.g., FIG. 7).

Figure 5:
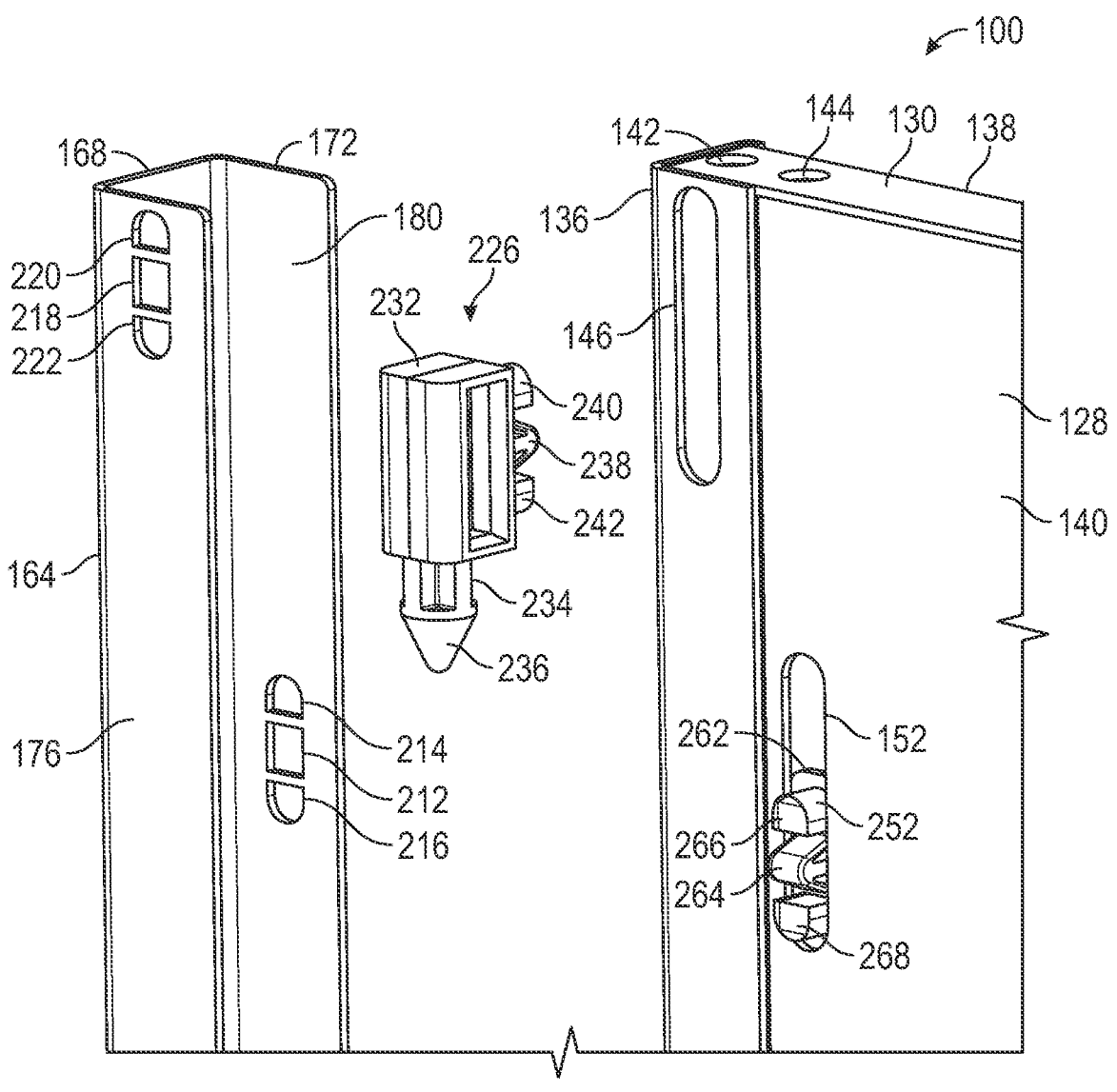
FIG. 5 is a detailed perspective, exploded view of a handle, cover and latch pin of an exemplary dual hinge cable management cover of FIG. 1.

The first side members 170, 172 of each handle 162, 164 include mounting holes 200, 202, 204, 206, 208, 210 in the form of three adjacently positioned holes 212, 214, 216 (see, e.g., FIGS. 2 and 5). The central hole 212 defines a substantially square or rectangular configuration, and the top and bottom holes 214, 216 define upwardly and downwardly facing D-shaped configurations. The side member 170 of handle 162 includes mounting holes 200, 204, 208 and the side member 172 of handle 164 includes mounting holes 202, 206, 210. The lateral and vertical position of the mounting holes 200-210 are complementary to the position of slots 150-160 of panel 128. In particular, when the handles 162, 164 are assembled with the panel 128 (such that the top edges of the handles 162, 164 are vertically offset from the top edge 130 of the panel 128, as illustrated in FIG. 6), the bottom holes 216 of each of the mounting holes 200-210 can substantially align with the bottom curvature of the respective slots 150-160.

The second side members 174, 176 of each handle 162, 164 include similarly grouped mounting holes in the form of three adjacently positioned holes 218, 220, 222. The central hole 218 defines a substantially square or rectangular configuration, and the top and bottom holes 220, 222 define upwardly and downwardly facing D-shaped configurations (see, e.g., FIG. 5). Although illustrated only at the top edge of the second side member 176 of the handle 164, the same holes 218, 220, 222 are located at or near the top edge of the second side member 174 of the handle 162, and at or near the bottom edge of the second side members 174, 176 of the handles 162, 164. When the handles 162, 164 are assembled with the panel 128 (as illustrated in FIG. 6), the bottom holes 222 can substantially align with the bottom curvature of the respective slots 146, 148 at the corners of the panel 128.

After the handles 162, 164 have been positioned on either side of the panel 128, pins 224, 226, 228, 230 can be engaged with the respective holes 218-222 of the second side members 174, 176 of each handle 162, 164. FIGS. 5 and 6 show detailed views of the pin 226. However, it should be understood that each of pins 224-230 includes the features discussed with respect to pin 226. In particular, each pin 224-230 includes a body 232 with a post 234 extending from the bottom surface of the body 232 and defining a cone-shaped or tapered endpoint 236. The body 232 includes three extensions 238, 240, 242 protruding from the body 232 in the same direction and perpendicularly relative to the post 234 and endpoint 236.

Figure 6:
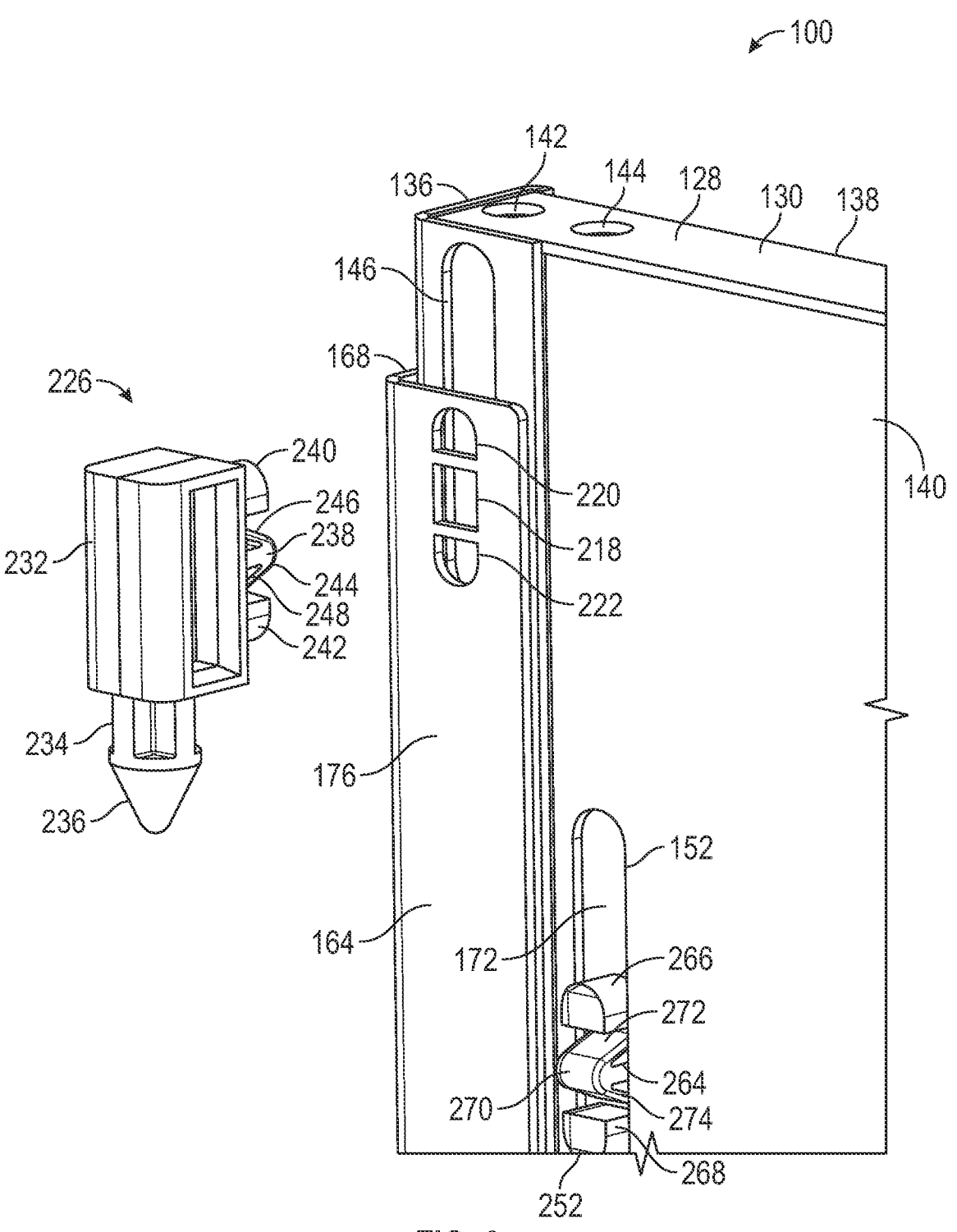
FIG. 6 is a detailed perspective, exploded view of a handle, cover and latch pin of an exemplary dual hinge cable management cover of FIG. 1.

The central extension 238 includes a pointed distal end 244 with flanges 246, 248 extending rearward from the pointed distal end 244 towards the body 232 (see, e.g., FIG. 6). The flanges 246, 248 are flexibly formed relative to the body of the extension 238, allowing for flanges 246, 248 to flex towards each other when a force is applied on the flanges 246, 248, and spring outward into the normal extended position when the force is removed from the flanges 246, 248. The extensions 240, 242 define a substantially D-shaped profile complementary to the D-shaped openings 220, 222 in the handles 162, 164.

During assembly, the holes 218-222 are initially aligned with the respective slot 146, 148 of the handles 162, 164 and the extensions 238-242 are press fit into the holes 218-222. Upon insertion of the extension 238 into the hole 218, the flanges 246, 248 initially flex inward toward each other to allow for passage of the extension 238 through the hole 218, and subsequently spring outward to prevent removal of the extension 238 from the hole 218. The extensions 240, 242 pass through respective holes 220, 222 and assist with aligned of the pin 226 with the endpoint 236 facing downward. Each of the pins 224-230 can be similarly assembled with the respective handles 162, 164, which couples the second side member 174, 176 of the handles 162, 164 to the panel 128. The extensions 238-242 pass at least partially into the slot 146, 148, allowing for vertical sliding of the extensions 238-242 along the slot 146, 148 when the handle 162, 164 slides vertically relative to the panel 128. The length of the slot 146, 148 provides a limit or range along which sliding of the extensions 238-242 is permitted. Due do the engagement of the pins 224-230 with the respective holes 218-222, sliding of the pins 224-230 simultaneously slides the handle 162, 164.

Fasteners 250-260 having a latching structure similar to the pins 224-230 can be used to slidably secure the first side members 170, 172 of handles 162, 164 to the panel 128. FIGS. 5 and 6 show detailed views of the fastener 252, although it should be understood that each of the fasteners 250-260 includes the same features as fastener 252. Each fastener 250-260 includes a body 262 with three extensions 264, 266, 268 protruding perpendicularly therefrom in the same direction. The extensions 264, 266, 268 can be identical in configuration and operation to the extensions 238-242 of the pins 224-230, including a pointed distal end 270 of the central extension 264 and flexible flanges 272, 274.

The extensions 264-268 are configured to pass through and engage with respective holes 212-216 formed in the first side members 170, 172 of handles 162, 164. The extension 264 can snap into the central hole 212, and extensions 266, 268 pass through holes 214, 216 to assist with alignment of the fastener 250-260. The extensions 264-268 extend at least partially through the slot 150-160 such that the fastener 250-260 slides along the slot 150-160 during vertical sliding of the handle 162, 164 relative to the panel 128. The length of the slot 150-160 provides a limit or range along which sliding of the extensions 264-268 is permitted. Due do the engagement of the fasteners 250-260 with the respective holes 212-216, sliding of the fasteners 250-260 simultaneously slides the handle 162, 164.

Figure 7:
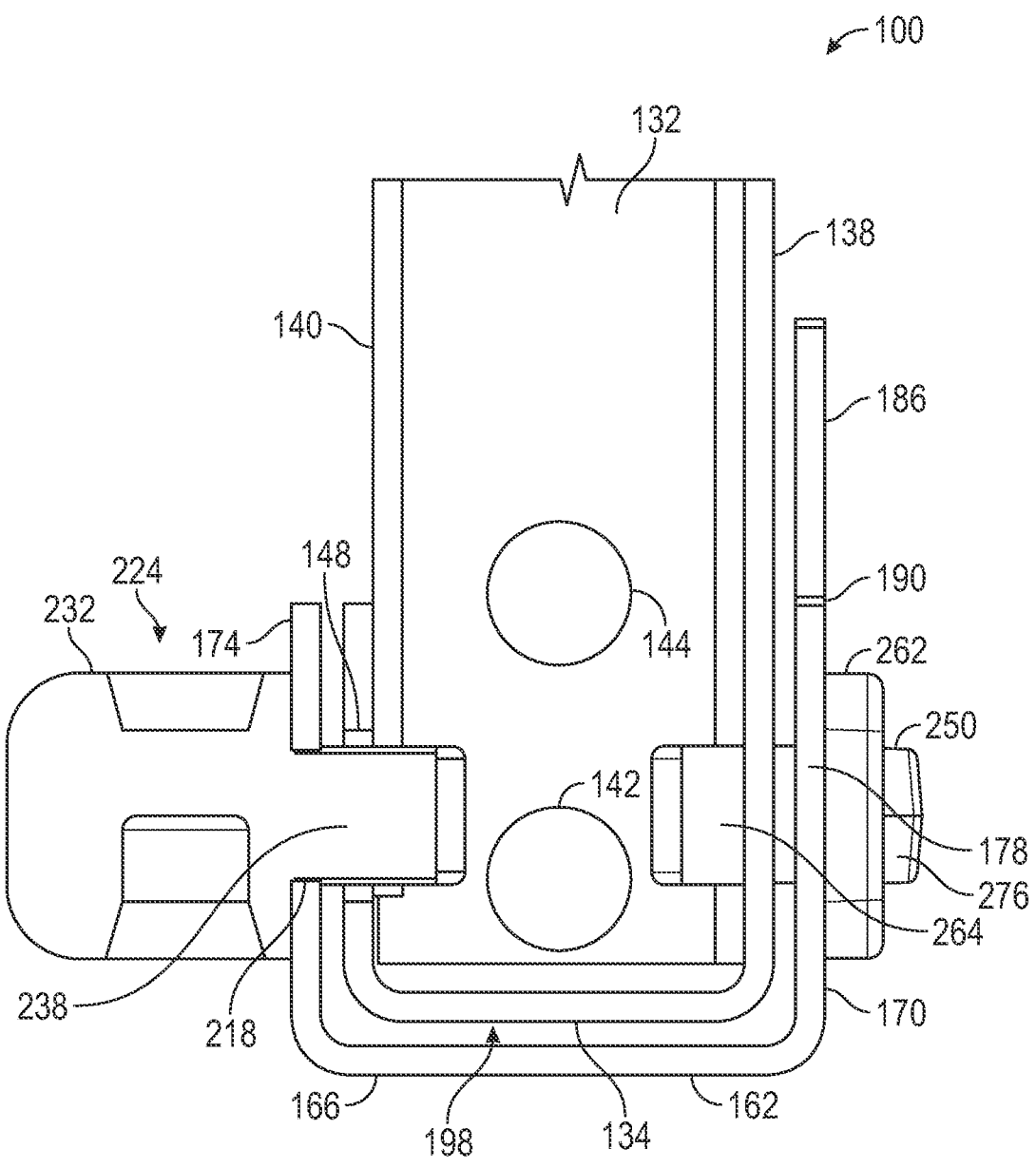
FIG. 7 is a detailed cross-sectional, top view of an exemplary dual hinge cable management cover of FIG. 1.
Figure 8:
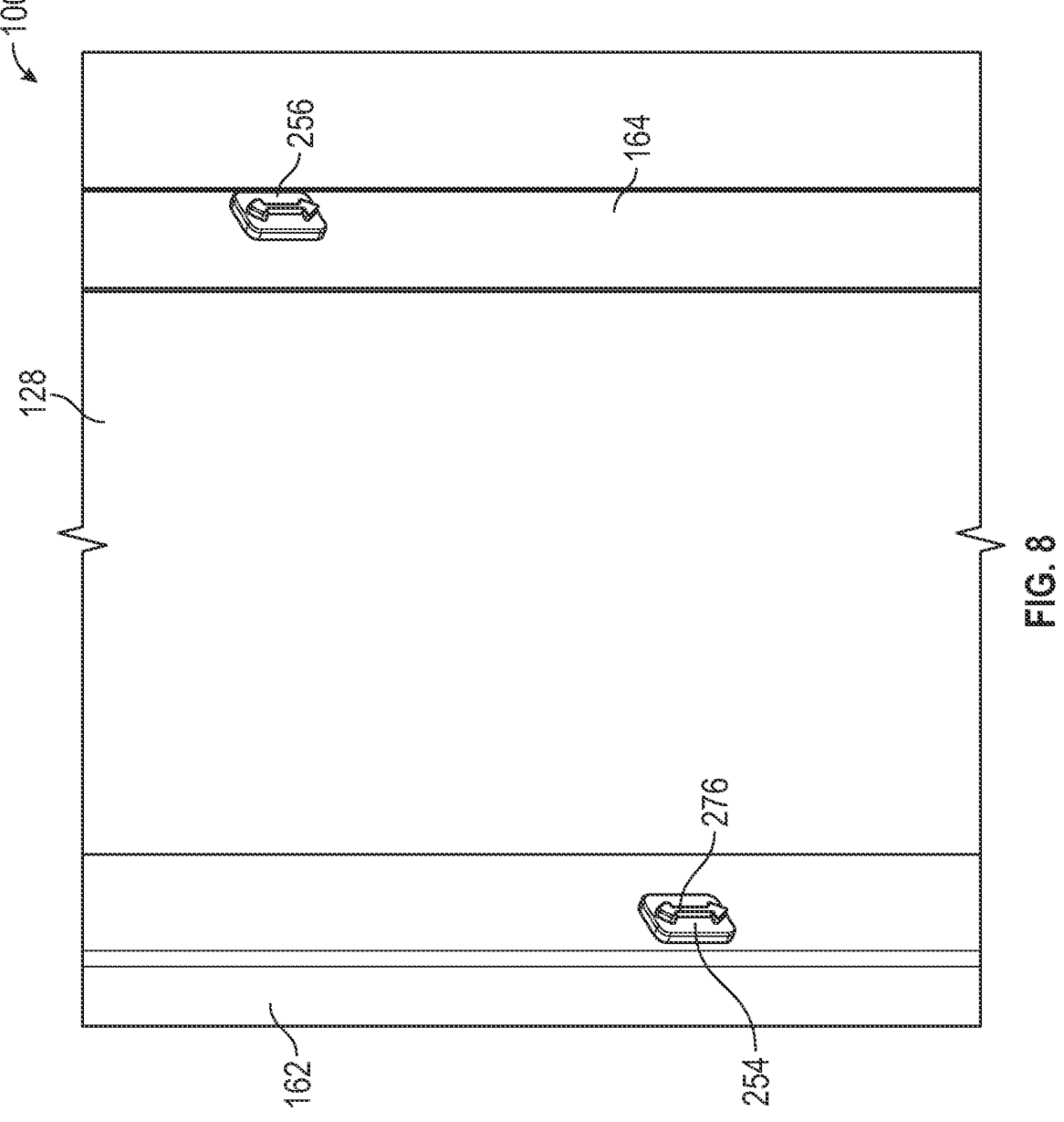
FIG. 8 is a detailed, perspective view of an exemplary dual hinge cable management cover of FIG. 1 including grip sections.
Figure 9:
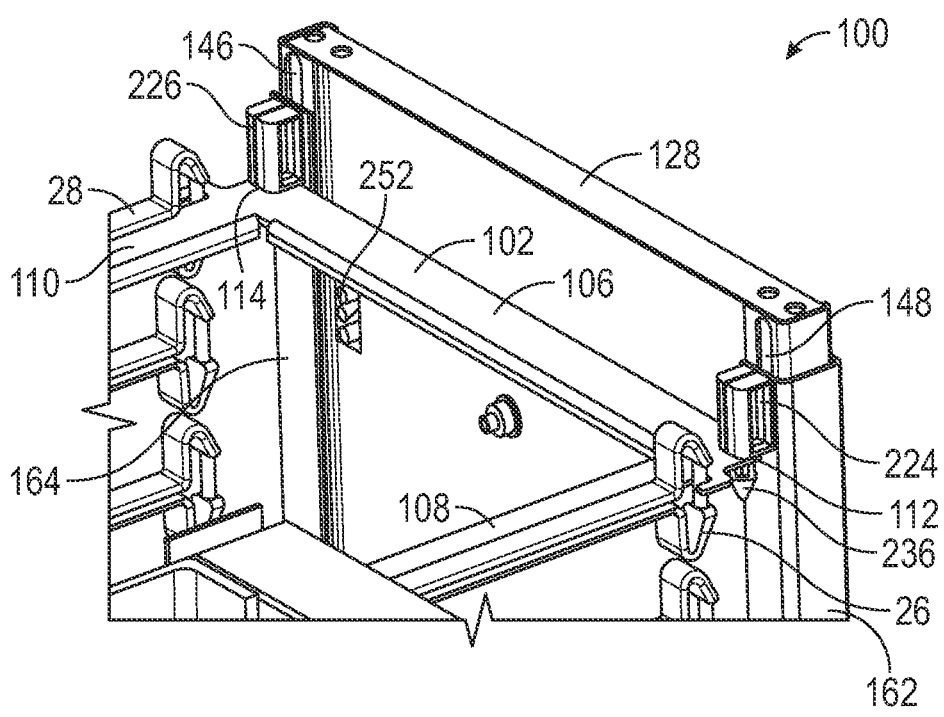
FIG. 9 is a detailed, perspective rear view of a top section of an exemplary dual hinge cable management cover of FIG. 1 in a closed position.
Figure 10:
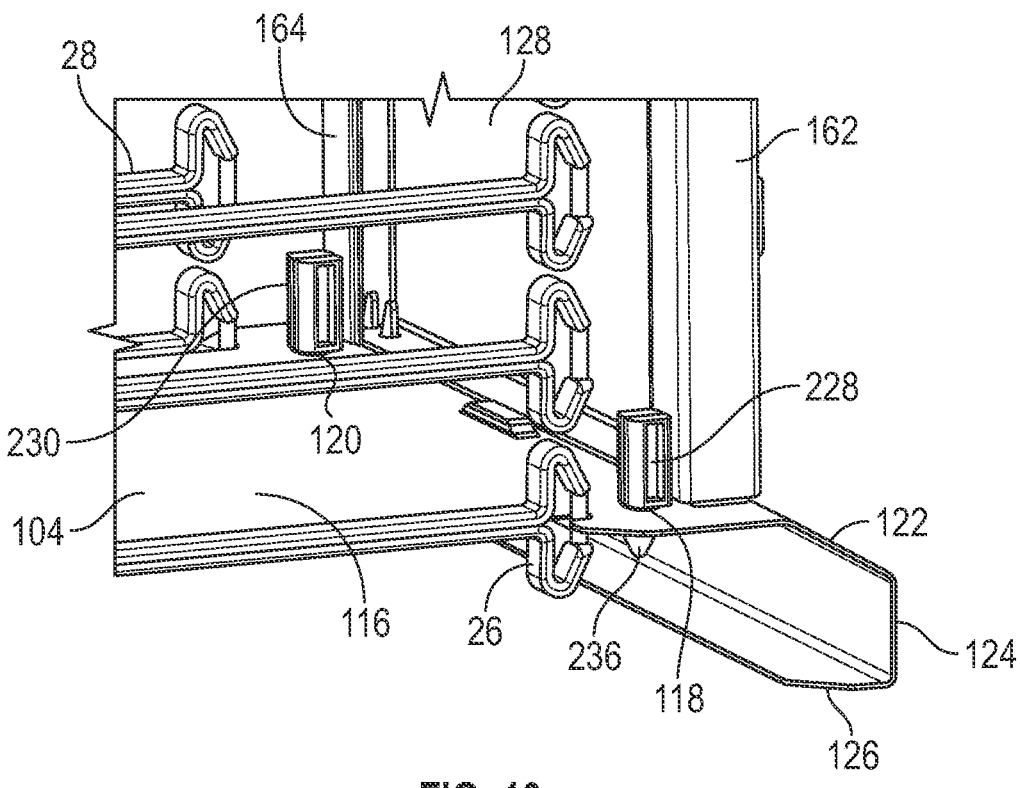
FIG. 10 is a detailed, perspective rear view of a bottom section of an exemplary dual hinge cable management cover of FIG. 1 in a closed position.
Figure 11:
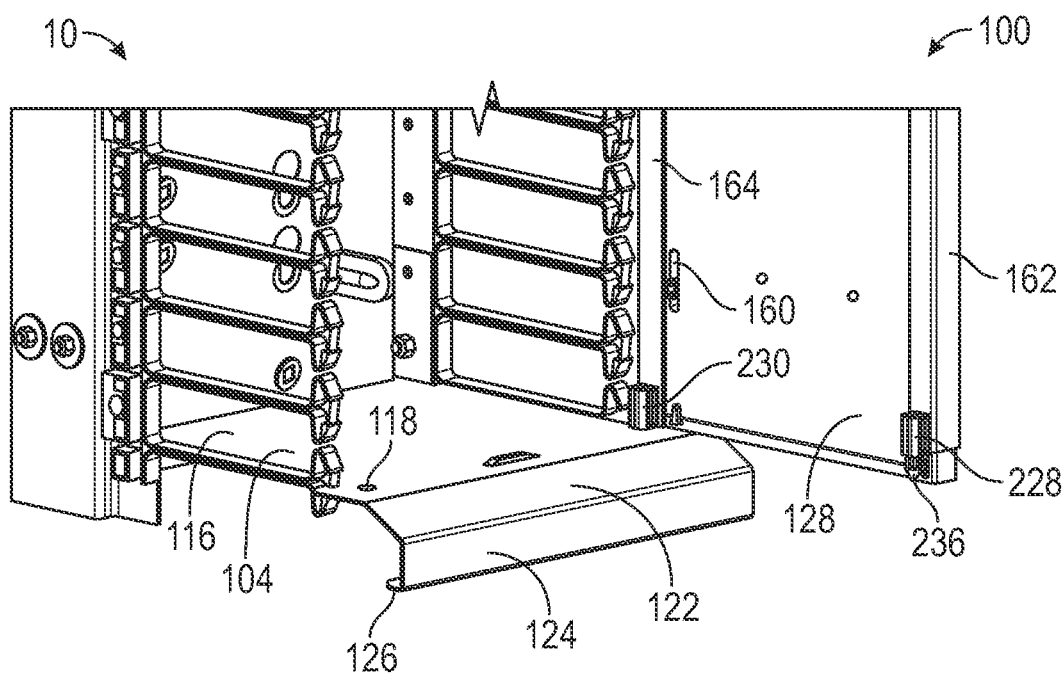
FIG. 11 is a detailed, perspective view of a bottom section of an exemplary dual hinge cable management cover of FIG. 1 in an open position.

The opposing side of the body 262 can include an indicator structure 276 (e.g., a double-sided arrow or any other visual cue) to identify direction the fasteners 250-260 can be slid vertically by the user (see, e.g., FIGS. 7 and 8). Use of the pins 224-230 and the fasteners 250-260 couples the handles 162, 164 to the panel 128 in a manner that allows for the handles 162, 164 independently slide vertically relative to the panel 128. Although the fasteners 250-260 can be used as a grip to slide the respective handle 162, 164, the handle 162, 164 itself can also be gripped anywhere to permit vertical sliding.

After the handles 162, 164 have been assembled with the panel 238, the cover 100 can be installed relative to the patch cord manager 10. The handles 162, 164 can be slid upwards along the sides of the panel 238 to allow for each of the endpoints 236 of the pins 224-230 to pass through the respective openings 112, 114 of the bracket 102 and openings 118, 120 of the base 104 (see, e.g., FIGS. 9 and 10). Such engagement of the pins 224-230 and openings 112, 114, 118, 120 locks the cover 100 relative to the patch cord manager 10.

If opening and pivoting of the cover 100 along the left vertical axis is desired, the right handle 164 can be slid upwards to disengage the pins 226, 230 from the openings 114, 120 of the bracket 102 and base 104. The continued engagement of the pins 224, 228 with the openings 112, 118 of the bracket 102 and base 104 allow for the pins 224, 228 to act as a common hinge or pivot axis for the cover 100. Only one of fasteners 252, 256, 260 needs to be used for sliding of the handle 164, although two or more fasteners 252, 256, 260 could be used.

If opening and pivoting of the cover 100 along the right vertical axis is desired, the left handle 164 can be slid upwards to disengage the pins 224, 228 from the openings 112, 118 of the bracket 102 and base 104. The continued engagement of the pins 226, 230 with the openings 114, 120 of the bracket 102 and base 104 allow for the pins 226, 230 to act as a common hinge or pivot axis for the cover 100. Only one of fasteners 250, 254, 258 needs to be used for sliding of the handle 162, although two or more fasteners 250, 254, 258 could be used.

The cover 100 can thereby be selectively opened in either direction depending on the needs of the user and/or the surrounding environment. Once opened, closure of the cover 100 can be achieved in two ways. In one instance, the handle 162, 164 with the disengaged pins 224-230 can be slid upward along the panel 128 and the cover 100 can be rotated into the closed position before the handle 162, 164 is permitted to slide down due to weight of the handle 162, 164, thereby engaging the pins 224-230 with the respective openings 112, 114, 118, 120.

Figure 12:
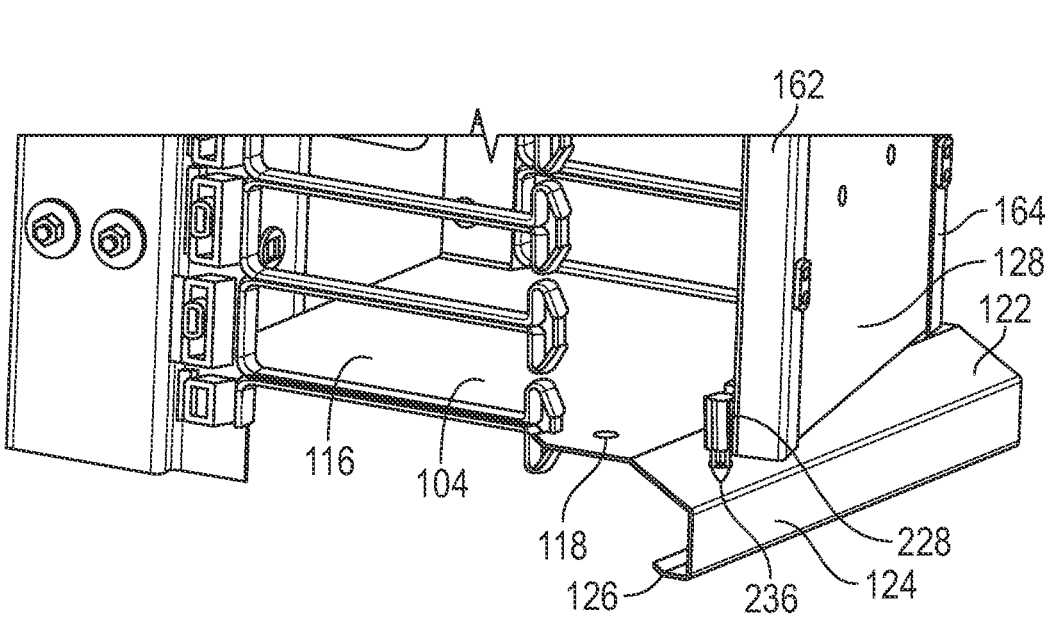
FIG. 12 is a detailed, perspective view of a bottom section of an exemplary dual hinge cable management cover of FIG. 1 in a partially open position.

In another instance, the cover 100 can be rotated into the closed position without manual sliding of the handle 162, 164. In such instance, as illustrated in FIG. 12, the pin 224-230 can slide upward along the angled section 122 of the base 104, with such sliding automatically sliding the handle 162, 164 along the panel 128 until the main body section 116 of the base 104 is reached. Continued pivoting of the cover 100 into the closed position allows for engagement of the pins 224-230 with the respective openings 112, 114, 118, 120 to ensure the cover 100 remains in the closed position. If complete removal of the cover 100 is desired, both handles 162, 164 can be slid upwards to disengage the pins 224-230 from the openings 112, 114, 118, 120. The exemplary cover 100 therefore provides a convenient means for selectively opening of the cover 100 along either a right vertical axis or a left vertical axis, or for removal of the cover 100 completely.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A cable management cover, comprising:
    a panel defining a front surface, a rear surface, a top edge, a bottom edge opposing the top edge, a first side edge, and a second side edge opposing the first side edge;
    a first handle slidably coupled to the first side edge of the panel;
    a second handle slidably coupled to the second side edge of the panel;
    a first pair of pins associated with the first handle and movable with the first handle during sliding of the first handle along the first side edge of the panel; and a second pair of pins associated with the second handle and movable with the second handle during sliding of the second handle along the second side edge of the panel;

wherein the first pair of pins define a first axis of rotation about which the cable management cover is rotatable; and wherein the second pair of pins define a second axis of rotation about which the cable management cover is rotatable.

2. The cable management cover of claim 1, wherein the first pair of pins and the second pair of pins are configured to engage with holes of a patch cord manager or rack.

3. The cable management cover of claim 2, wherein disengagement of the first pair of pins from the holes of the patch cord manager or rack allow for rotation of the cable management cover about the second axis of rotation defined by the second pair of pins.

4. The cable management cover of claim 2, wherein disengagement of the second pair of pins from the holes of the patch cord manager or rack allow for rotation of the cable management cover about the first axis of rotation defined by the first pair of pins.

5. The cable management cover of claim 1, wherein the first handle and the second handle each define a U-shaped configuration including a central member, a front side member extending perpendicularly from a first edge of the central member, and a rear side member extending perpendicularly from a second edge of the central member.

6. The cable management cover of claim 5, wherein the central member is configured to be disposed adjacent to the first side edge or the second side edge of the panel, respectively, the front side member is configured to be disposed adjacent to the front surface of the panel, and the rear side member is configured to be disposed adjacent to the rear surface of the panel.

7. The cable management cover of claim 5, wherein the front side member includes holes configured to receive a fastener to couple the first handle or the second handle to the panel, the fastener slidable within a complementary slot in the panel during sliding of the first handle or the second handle relative to the panel.

8. The cable management cover of claim 5, wherein the rear side member includes holes configured to receive extensions of the first pair of pins or the second pair of pins, respectively, to couple the first handle or the second handle to the panel, the extensions slidable within a complementary slot in the panel during sliding of the first handle or the second handle relative to the panel.

9. The cable management cover of claim 1, wherein each pin of the first pair of pins and the second pair of pins includes a body with a tapered endpoint extending from a bottom surface of the body, the tapered endpoint configured to engage with holes of a patch cord manager or rack for locking of the cable management cover relative to the patch cord manager or rack.

10. A cable management cover system, comprising:

a mounting bracket configured to be coupled at or near a top of a patch cord manager or rack, the mounting bracket including a first hole and a second hole formed therein;

a base configured to be coupled at or near a bottom of the patch cord manger or rack, the base including a third hole and a fourth hole formed therein; and a cable management cover including:

a panel defining a front surface, a rear surface, a top edge, a bottom edge opposing the top edge, a first side edge, and a second side edge opposing the first side edge;

a first handle slidably coupled to the first side edge of the panel;

a second handle slidably coupled to the second side edge of the panel;

a first pair of pins associated with the first handle and movable with the first handle during sliding of the first handle along the first side edge of the panel, the first pair of pins is configured to be engaged and disengaged relative to the first hole of the mounting bracket and the third hole of the base; and a second pair of pins associated with the second handle and movable with the second handle during sliding of the second handle along the second side edge of the panel, the second pair of pins is configured to be engaged and disengaged relative to the second hole of the mounting bracket and the fourth hole of the base;

wherein the first pair of pins define a first axis of rotation about which the cable management cover is rotatable relative to the patch cord manager or rack; and wherein the second pair of pins define a second axis of rotation about which the cable management cover is rotatable relative to the patch cord manager or rack.

11. The cable management cover system of claim 10, wherein the base includes a planar main body section including the third and fourth holes, and an angled section extending from a proximal edge of the planar main body section.

12. The cable management cover system of claim 11, wherein the angled section extends downwardly from the proximal edge of the planar main body section such that a proximal edge of the angled section is disposed at a plane below a plane of the proximal edge of the planar main body section.

13. The cable management cover system of claim 11, wherein one of the first pair of pins or one of the second pair of pins is configured to engage with a travel upward along the angled section during pivoting of the cable management cover into a closed position.

14. The cable management cover system of claim 10, wherein the first handle and the second handle each define a U-shaped configuration including a central member, a front side member extending perpendicularly from a first edge of the central member, and a rear side member extending perpendicularly from a second edge of the central member.

15. The cable management cover system of claim 14, wherein the central member is configured to be disposed adjacent to the first side edge or the second side edge of the panel, respectively, the front side member is configured to be disposed adjacent to the front surface of the panel, and the rear side member is configured to be disposed adjacent to the rear surface of the panel.

16. The cable management cover system of claim 14, wherein the front side member includes holes configured to receive a fastener to couple the first handle or the second handle to the panel, the fastener slidable within a complementary slot in the panel during sliding of the first handle or the second handle relative to the panel.

17. The cable management cover system of claim 14, wherein the rear side member includes holes configured to receive extensions of the first pair of pins or the second pair of pins, respectively, to couple the first handle or the second handle to the panel, the extensions slidable within a complementary slot in the panel during sliding of the first handle or the second handle relative to the panel.

18. The cable management cover system of claim 10, wherein each pin of the first pair of pins and the second pair of pins includes a body with a tapered endpoint extending from a bottom surface of the body, the tapered endpoint configured to engage with the first, second, third or fourth holes of the mounting bracket and the base, respectively, for locking of the cable management cover relative to the patch cord manager or rack.

19. The cable management cover system of claim 10, wherein the first handle and the second handle are independently slidable upwards and downwards along a vertical direction relative to the respective first and second side edges of the panel to engage and disengage the first and second pairs of pins with the respective first, second, third, and fourth holes of the mounting bracket and the base.

20. A method of cable management, the method comprising:

engaging a first pair of pins of a cable management cover with a first set of holes associated with a patch cord manager or rack, the cable management cover including a first handle slidably coupled to a first side edge of a panel, the first pair of pins associated with the first handle; and engaging a second pair of pins of the cable management cover with a second set of holes associated with a patch cord manager or rack, the cable management cover including a second handle slidably coupled to a second side edge of the panel, the second pair of pins associated with the second handle;

wherein the cable management cover is operable by both:

sliding the first handle relative to the first side edge of the panel to disengage the first pair of pins from the first set of holes associated with the patch cord manager or rack to allow the second pair of pins to define an axis of rotation about which the cable management cover is rotatable relative to the patch cord manager or rack; and sliding the second handle relative to the second side edge of the panel to disengage the second pair of pins from the second set of holes associated with the patch cord manager or rack to allow the first pair of pins to define an axis of rotation about which the cable management cover is rotatable relative to the patch cord manager or rack.

* * * * *